United States Patent [19]

Bertho et al.

[11] Patent Number: 5,076,804
[45] Date of Patent: Dec. 31, 1991

[54] ELECTRICAL CONNECTOR ASSEMBLY FOR MOUNTING ON A PRINTED CIRCUIT BOARD

[75] Inventors: Dominique Bertho, Limerick; Richard Donnelly, Shannon Co. Clare; Patrick Kirby, Sixmilebridge, all of Ireland

[73] Assignee: Molex Incorporated, Lisle, Ill.

[21] Appl. No.: 618,549

[22] Filed: Nov. 27, 1990

[51] Int. Cl.$^5$ .................. H01R 13/428; H01R 23/68
[52] U.S. Cl. .................................... 439/567; 439/82
[58] Field of Search .................. 439/55, 78, 81, 82, 439/83, 84, 567, 571, 572, 746, 747, 748, 872, 873; 29/837–839, 843, 845

[56] References Cited

U.S. PATENT DOCUMENTS

| | | | |
|---|---|---|---|
| 2,316,555 | 4/1943 | Bugg | 439/82 |
| 4,129,351 | 12/1978 | Sugimoto et al. | 439/630 |
| 4,353,609 | 10/1982 | Haas | 439/82 |
| 4,713,013 | 12/1987 | Regnier | 439/633 |
| 4,780,093 | 10/1988 | Walse | 29/881 |
| 4,907,978 | 3/1990 | Bowen | 439/79 |

Primary Examiner—Neil Abrams
Attorney, Agent, or Firm—Louis A. Hecht; Stephen Z. Weiss; A. A. Tirva

[57] ABSTRACT

An electrical connector assembly is provided for mounting on a printed circuit board which includes at least a pair of mounting post-receiving holes and at least one solder tail-receiving aperture. The assembly includes a housing having at least a pair of mounting posts for positioning in the holes in the printed circuit board. At least one contact member is mounted on the housing and includes a solder tail for positioning in the aperture in the printed circuit board. The solder tail has a generally straight side and a projecting hook on an opposite side for retaining the connector assembly on the printed circuit board. The width of the solder tail between the straight side and the outermost point of the hook on the opposite side is no greater than the width of the aperture, and the centerline of the solder tail between its sides is offset, in the direction of the hook, relative to the centerline of the aperture when the mounting posts are aligned with the holes in the printed circuit board.

8 Claims, 2 Drawing Sheets

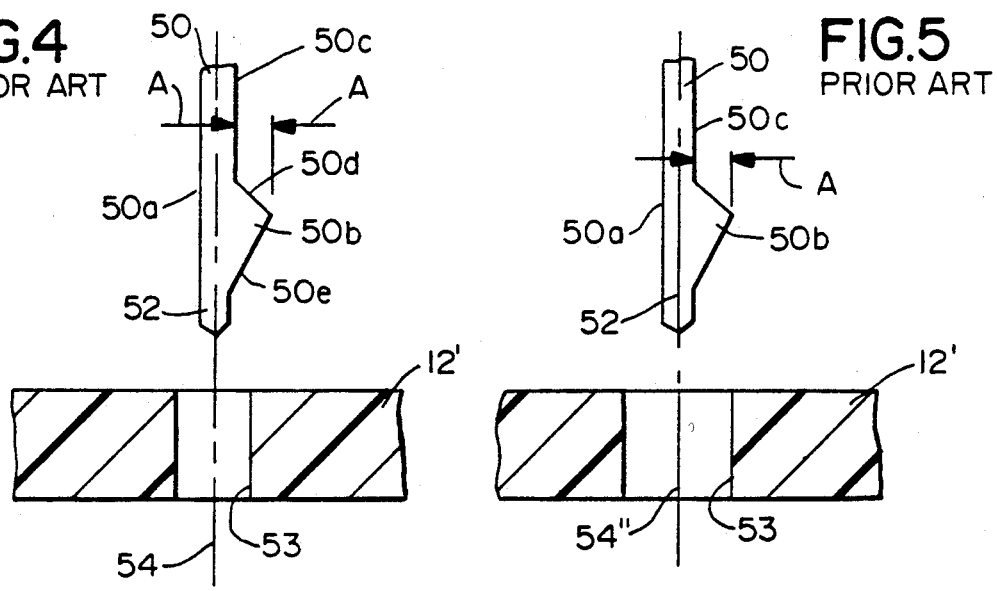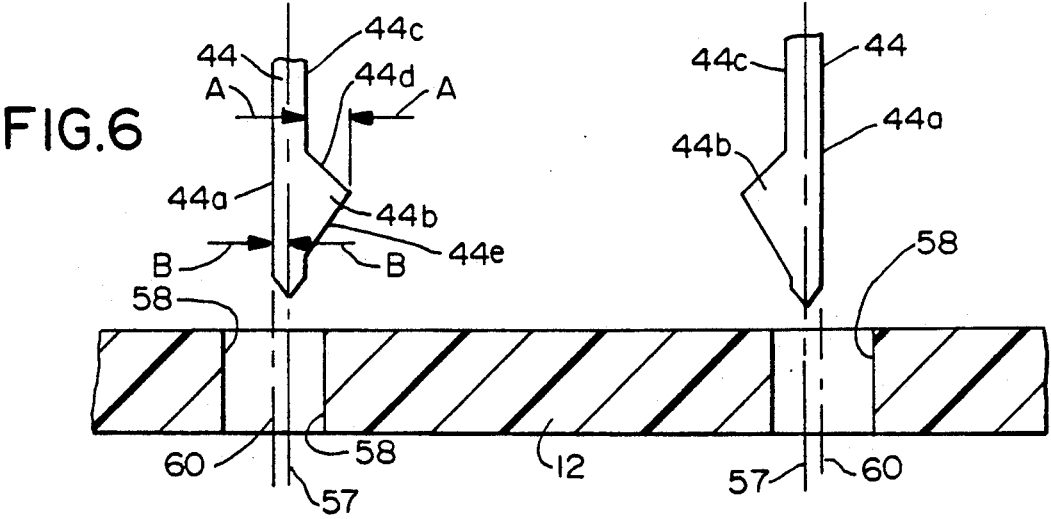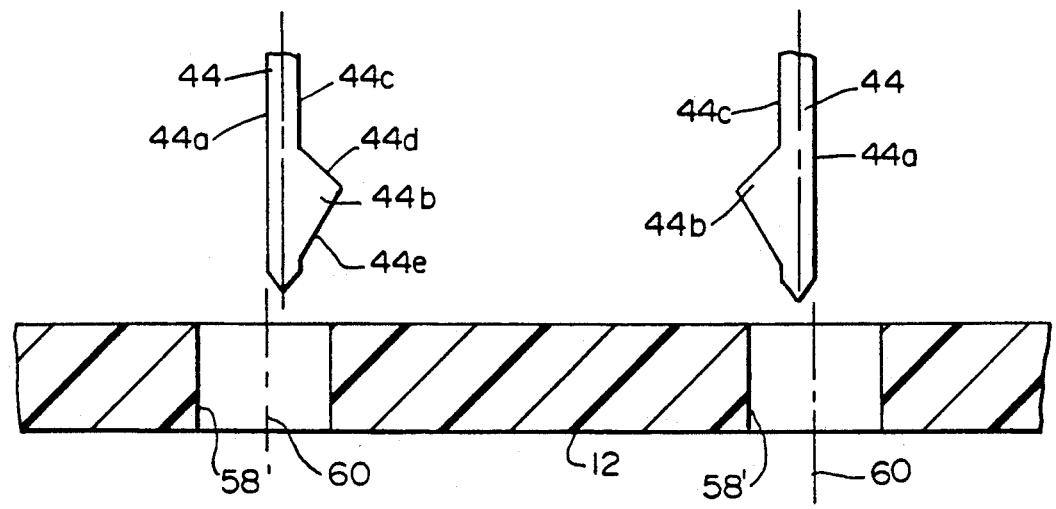

ELECTRICAL CONNECTOR ASSEMBLY FOR MOUNTING ON A PRINTED CIRCUIT BOARD

FIELD OF THE INVENTION

This invention generally relates to electrical connectors and, particularly, to an improved electrical connector assembly of the type adapted for post mounting on a printed circuit board.

BACKGROUND OF THE INVENTION

Multi-circuit electrical connectors of the type adapted for mounting on a printed circuit board typically include a plurality of electrical contact members or terminals disposed within a unitary dielectric housing, normally a molded plastic housing in which the contacts are inserted following molding. In these arrangements, the housing typically surrounds portions of the terminals immediately adjacent the printed circuit board to provide rigid support for the terminals.

Examples of such electrical connector assemblies are shown in U.S. Pat. No. 4,713,013 to Regnier et al., dated Dec. 15, 1987, and U.S. Pat. No. 4,780,093 to Walse et al., dated Oct. 25, 1988, both of which are assigned to the assignee of this invention.

Electrical connector assemblies of the character described usually are mounted on the printed circuit board by means of one or more mounting posts positioned in holes in the printed circuit board, normally at least two posts spaced apart and molded integrally with the housing. In elongate high density multi-circuit electrical connector assemblies, the mounting posts usually are disposed at or near opposite ends of the housing.

The contact members of such connector assemblies often have solder tails insertable through apertures in the printed circuit board for soldering to circuit traces or pads on the board. This solder tails sometimes also are used to lock the connector assembly to the circuit board prior to soldering. The locking often is accomplished by enlarged head portions or laterally projecting hooks which snap under the bottom side of the printed circuit board and thereby hold the connector assembly to the board. With high density multi-circuit electrical connectors, the contact members are thin stamped contacts, with a stamped locking hook projecting outwardly from one side of the solder tail portion of the contact.

One of the problems in using "hooked" solder tails of the contact members for locking the connector assembly to the board is in accommodating variances in the size of the apertures in the board through which the solder tails are inserted. Heretofore, the centerlines of the hooked solder tails have been aligned with the centerlines of the apertures when the centerlines of the mounting posts are inserted into the holes in the printed circuit board. The width of the solder tails between one side thereof and the outermost point of the hook on an opposite side thereof cannot be greater than the smallest width of the aperture through which the hooked solder tail is to be inserted. Consequently, if an aperture in the board is enlarged through manufacturing tolerances or whatever, the retention or locking capabilities of the hook on the solder tail is reduced. It can be understood that a point is reached quite readily where variations in the aperture width are not compatible with the necessary or required retention capabilities of the hooked solder tails.

This invention is directed to solving the above problems by providing an electrical connector assembly with contact members having hooked solder tails which are considerably less sensitive to variations in the apertures in the printed circuit board through which the solder tails are inserted, than was heretofore available.

SUMMARY OF THE INVENTION

An object, therefore, of the invention is to provide a new and improved electrical connector assembly for mounting on a printed circuit board by means of mounting posts and contact solder tails.

In the exemplary embodiment of the invention, the printed circuit board includes at least a pair of holes for receiving mounting posts on the connector and at least one aperture for receiving a solder tail of a contact member on the connector. A connector housing is provided with at least a pair of mounting posts for positioning in the holes in the printed circuit board. At least one contact member is mounted on the housing and includes a solder tail for positioning in the aperture of the printed circuit board. The solder tail has a generally straight side and a projecting hook on an opposite side for retaining the connector on the printed circuit board. The width of the solder tail between the straight side and the outermost point of the hook on the opposite side is no greater than the width of the aperture. The centerline of the solder tail between the sides is offset, in the direction of the hook, relative to the centerline of the aperture when the mounting posts are mounted in the holes in the printed circuit board.

The invention is disclosed herein in a high density multi-circuit electrical connector assembly which includes a pair of elongate housings each having a cavity along its length for receiving a mating edge of another printed circuit board. A plurality of contact members are arranged on the housing in a linear array. The contact members are thin and closely-spaced and adapted to engage contact pads on the other printed circuit board when the second printed circuit board is inserted into the cavity. Each contact member has a solder tail according to the invention. The pair of elongated housings are fixed together in spaced, generally parallel relationship, and the contact members on the respective housings are arranged such that the hooks on the solder tails of one housing face opposite the hooks on the solder tails of the other housing. Of course, a single housing connector with two or more rows of contact members is contemplated. With two rows of contact members, the hooks on the solder tails in one row can face the hooks in the other row, or the hooks the solder tails in the respective rows can face outwardly in opposite directions.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the following description taken in conjunction with the accompanying drawings, in which like reference numerals identify like elements in the figures and in which:

FIG. 4 is a fragmented side elevational view, on a further enlarged scale, illustrating hooked solder tail aligned with an aperture in a printed circuit board, according to the prior art;

FIG. 5 is a view similar to that of FIG. 4, with the aperture in the printed circuit board being enlarged;

FIG. 6 is a fragmented side elevational view of a pair of opposed solder tails aligned with a pair of apertures in a printed circuit board, according to the invention; and FIG. 7 is a view similar to that of FIG. 6, with the apertures in the printed circuit board enlarged.

DETAILED DESCRIPTION OF THE PREFERRED EMBODIMENT

Figure 1:
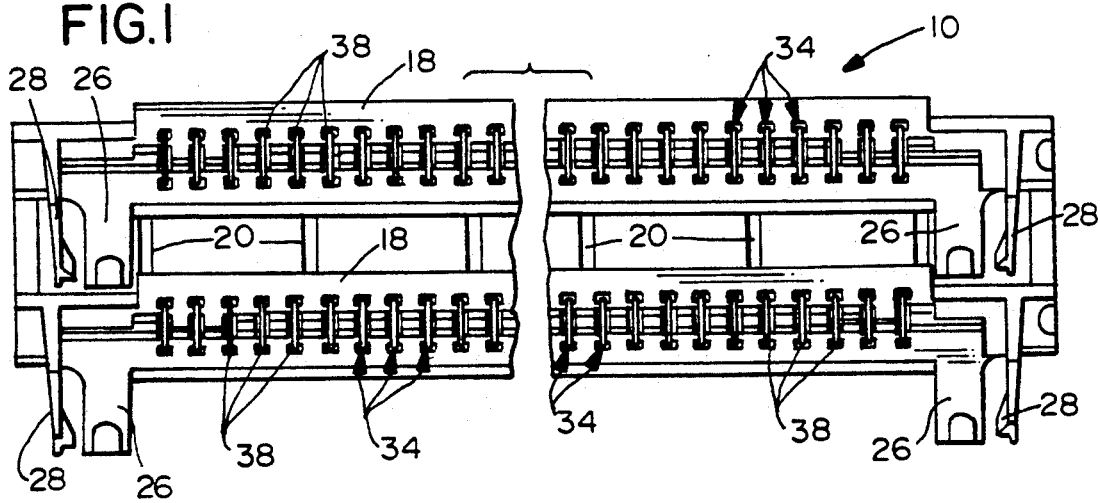
FIG. 1 is a top plan view of a connector assembly embodying the concepts cf the invention, the assembly including a pair of elongated housings joined in spaced parallel relationship by webs.
Figure 2:
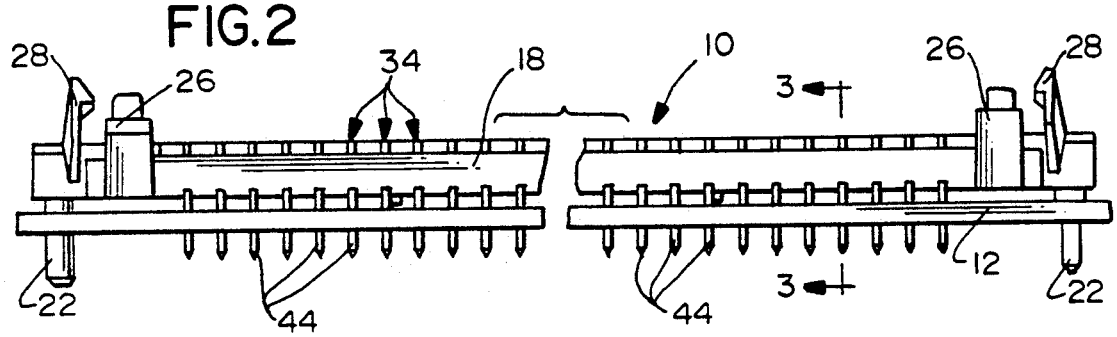
FIG. 2 is a side elevational view of the assembly of FIG. 1.
Figure 3:
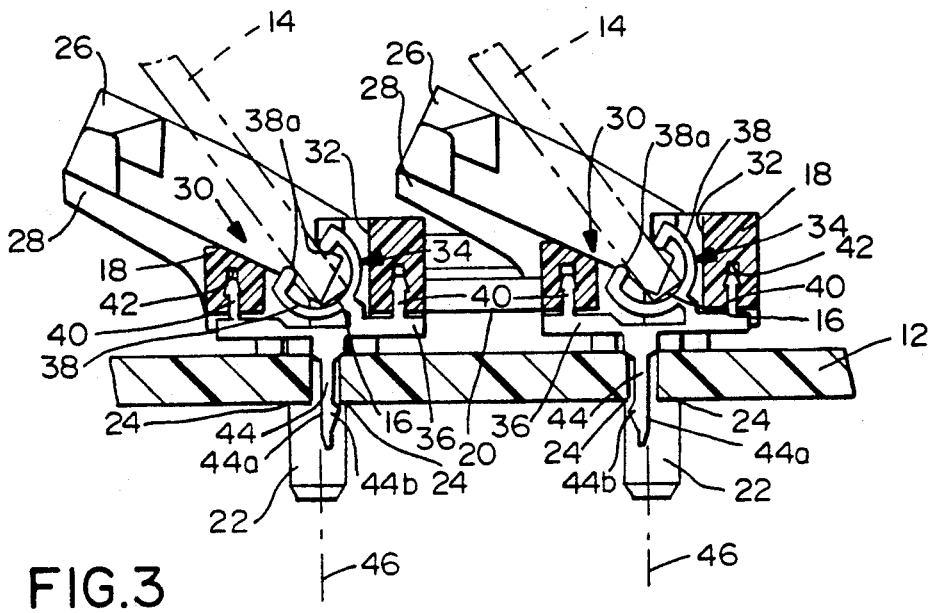
FIG. 3 is a vertical section, on an enlarged scale, taken generally along line 3—3 of FIG. 2.

Referring to the drawings in greater detail and first to FIGS. 1-3, a connector assembly, generally designated 10, is provided for electrically connecting closely-spaced circuit elements disposed on a first printed circuit board 12 (FIG. 2) and a pair of second printed circuit boards 14 (FIG. 3). Printed circuit board 12 commonly is called a mother board and is a high density printed circuit board including a plurality of closely-spaced circuit elements or traces on at least one major surface thereof. Printed circuit boards 14 commonly are called edge cards and each includes a mating edge 16 and a surface with a linear array of contact pads disposed in alignment adjacent the mating edge. Details of such a connector assembly, connecting a mother board to a single edge card, are shown in the aforesaid Regnier U.S. Pat. No. 4,713,013 which is incorporated herein by reference.

Suffice it to say, connector assembly 10 includes a pair of elongate housings 18 of substantially identical construction and spaced apart in generally parallel orientation by a plurality of joining webs 20 (FIGS. 1 and 3). Each housing 18 has a pair of mounting posts 22 (FIGS. 2 and 3), one at each opposite end of the housing, the mounting posts extending from the lower surface of the housing and adapted to be received within appropriate mounting holes 24 (FIG. 3) in mother board 12. In addition, each housing 18 has a pair of upstanding mounting posts 26 and yieldable latching posts 28 at opposite ends of the housing for yieldably retaining its respective edge card 14 in mated relationship with the housing. Again, further details of this general arrangement can be derived from the aforesaid '013 patent.

Referring particularly to FIG. 3, but in conjunction with FIGS. 1 and 2, each housing 18 is molded integrally of plastic material and includes a cavity, generally designated 30, along its length for receiving mating edge 16 of the respective edge card or printed circuit board 14. A plurality of closely-spaced compartments or narrow slots 32 are disposed along cavity 30, transversely of the cavity along the length of housing 18, for receiving a plurality of thin contact members, generally designated 34 (FIG. 3), to form a closely-spaced linear terminal array as shown in FIGS. 1 and 2.

Each contact 34 has a transverse bar 36 (FIG. 3) extending transversely of the elongate housing 18, cavity 30 and edge card 14. Contacts 34 are spring contact terminals and have rounded continuously curved, generally C-shaped contact arms 38 with distal ends 38a adapted to engage contact pads on edge card 14. Again, a generally similar C-shaped spring contact terminal is disclosed in detail in the U.S. Pat. No. 4,713,013 which is incorporated herein by reference.

Although the invention is shown in a connector arrangement which includes a pair of elongate housings fixed together in a spaced, generally parallel relationship, it should be understood that a single housing connector is contemplated, and the single housing can include two or more rows of contact members.

Each contact 34 is mounted to and rigidly supported on housing 18 by means of a pair of mounting posts 40 stamped integral with the thin contact at opposite ends of bar 36 for securely seating in sockets 42 molded integrally within housing 18. Each contact 34 also has a downwardly projecting solder tail 44 having a straight side 44a and a projecting hook 44b on the opposite side 44c. The hook is provided for snapping beneath the bottom surface of mother board 12 to retain the connector assembly on the printed circuit board at least prior to soldering the solder tails to appropriate circuit traces on the mother board. As described in greater detail hereinafter, the centerline of each solder tail between its sides is offset relative to the centerline of the printed circuit board. In the illustrated embodiment, straight side 44a of each solder tail 44 along each elongate housing 14 is aligned with the centerlines 46 (FIG. 3) of mounting posts 22, as well as the centerlines of the respective holes in the printed circuit board.

FIGS. 4 and 5 show a "hooked" solder tail 50 according to the prior art. Of course, the solder tail would be part of a connector assembly including appropriate mounting posts for insertion through holes in a printed circuit board 12'. Solder tail 50 of the prior art, like solder tail 44 of the invention, includes a straight side 50a and a hook 50b projecting outwardly from an opposite side 50c of the solder tail. The solder tail has a centerline 52 running longitudinally thereof equidistant between opposite sides 50a and 50c. The hook 50b is formed by two intersecting inclined surfaces 50d and 50e. Inclined surface 50d is adapted to engage the top surface of the printed circuit board when the solder tail 50 is inserted into aperture 53 for guiding the solder tail into the aperture. The inclined surface 50d is adapted to engage the bottom surface of the printed circuit board when the solder tail is within the aperture 53 for retaining the connector assembly on the printed circuit board.

The difference between FIGS. 4 and 5 is that an aperture 53 in FIG. 4 is smaller than aperture 53' in FIG. 5 through printed circuit board 12'. These differences in diameters or widths between apertures 53 and 53' represent normal manufacturing tolerances encountered in this art and which can be calculated through mass production sampling. It is important to note that the centerline 52 of solder tail 50 is in alignment with the centerlines 54 and 54' of apertures 53 and 53', respectively.

Starting with FIG. 4, it can be understood that the width of solder tail 50, between straight side 50a and the outermost point of hook 50b on the opposite side of the solder tail, must be no greater than the width of smaller aperture 53 through the printed circuit board, or else the solder tail could not be inserted through the aperture. On the other hand, in order to achieve good retention of the connector assembly on the printed circuit board, the solder tail must be dimensioned relative to the aperture so that there is sufficient clearance to allow the solder tail to be biased to the left (as viewed in the drawing) and then snap into a retention position whereby hook 50b overlaps the bottom surface of the printed circuit board as much as possible. In other words, the distance represented by arrows "A" not only represents the distance hook 50b projects outwardly from side 50c of the solder tail, but this distance represents the hole clearance and, thereby, the maximum retention capabilities of the solder tail as affected by the natural spring restoring forces of the metal solder tails. Yet, there must be provided sufficient clearance between straight side 50a of the solder tail and the interior dimensions of aperture 53 to allow displacement of the solder tail during insertion.

With the larger aperture 53' in FIG. 5, the dimension "A" must be large enough to still obtain a good retention in the larger diameter hole of the printed circuit board. As can be seen from these illustrations, a point very quickly is reached where the relationship between the distance "A" and the variations on the larger aperture diameters no longer affords an acceptable retention capability for the hooked solder tail. If there is a large variation on the aperture diameter, a sufficiently large dimension "A" is needed to achieve a good retention in the aperture, but the solder tail would have to be enlarged and, resultingly, could not be inserted into the smaller diameter aperture 53 (FIG. 4).

The invention herein solves the above problems and the considerable dilemma described in relation to the prior art in FIGS. 4 and 5, by offsetting the centerlines 57 of solder tails 44 relative to the centerlines 60 of the apertures in printed circuit board 12. This is shown in greater detail in FIGS. 6 and 7. In referring to these figures, it should be noted that two solder tails 44 are shown in each figure corresponding to the "double housing" assembly of FIGS. 1-3. The hooked portions 44b of the solder tails could point outwardly in opposite direction instead of toward each other as shown. Nevertheless, FIGS. 6 and 7 are depictions correlated to the varying diameters of apertures described in relation to FIGS. 4 and 5. FIG. 6 shows an aperture 58 of a minimum dimension, and FIG. 7 shows an aperture 58' of a maximum dimension, for each solder tail.

As illustrated in FIGS. 6 and 7, the invention contemplates offsetting centerline 57 of each solder tail 44 relative to centerline 60 of the respective aperture through which the solder tail is to be inserted. Of course, it should be understood that this alignment is calculated and maintained by mounting posts 22 (FIG. 3) being inserted through holes 24 in mother board 12. The lateral support afforded by the mounting posts allow the solder tails to deflect upon insertion into their respective apertures.

By offsetting the centerlines of the solder tails relative to the centerlines of their respective apertures in the printed circuit board, an offset dimension represented by arrows "B" (FIG. 6) creates an offset alignment of the solder tails with the apertures. This offset allows the dimension "A" to be reduced and still maintain good retention capabilities in larger aperture diameters as shown in FIG. 7, because of the increased displacement of the solder tails and their natural restoring forces, as well as in the smaller diameter apertures of FIG. 6. This phenomenon might easily be understood by considering that the invention has moved the back-and-forth "working area" of a solder tail to one side of its respective aperture in the printed circuit board. In this manner, a wider variance in the sizes of the apertures can be accommodated and manufacturing tolerances become much less critical.

More particularly, the dimension "B" is defined as an offset between the centerline of a solder tail, between its sides, and the centerline of the respective aperture in the printed circuit board. This dimension varies from product to product in relation with the tolerances in the particular aperture in the printed circuit board, but greater than zero. The maximum offset is defined by the flexibility of the solder tail itself.

In comparing the invention, shown and described in relation to FIGS. 6 and 7, with the problems and dilemma described in relation to the prior art of FIGS. 4 and 5, the width of the solder tail between the tip of hook 44b and side 44a is maintained the same (i.e. the same as the width between hook 50b and side 50a of solder tail 50 of the prior art). This is the minimum dimension of an aperture in the printed circuit board. However, the offset concept of the invention increases the utilization of the hook of the solder tail for the larger aperture dimension. With the invention, the interference with the aperture ("A" in the prior art) now becomes equal to the sum of dimensions "A" plus "B".

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electrical connector assembly for mounting on a printed circuit board which includes at least a pair of mounting post-receiving holes and at least one solder tail receiving aperture, comprising:

a housing including at least a pair of mounting posts for positioning in said holes of the printed circuit board; and at least one contact member mounted on the housing and including a one-piece solder tail for positioning in said aperture of the printed circuit board, the solder tail having a generally straight side and a projecting hook on an opposite side the hook comprising two inclined intersecting surface, one surface adapted to contact the top surface of the printed circuit board when the solder tail is inserted into the aperture for guiding the solder tail into the aperture, the other inclined surface adapted to engage the bottom surface of the printed circuit board for retaining the connector assembly on the printed circuit board, the width of the solder tail between the straight side and the outermost point of the hook on the opposite side being no greater than the width of the aperture, and the centerline of the solder tail between said sides being offset in the direction of the hook, relative to the centerline of the aperture when the mounting posts are aligned with the holes in the printed circuit board.

2. The assembly of claim 1, including a pair of said housings and respective contact members, means fixing the housings together in spaced relationship and wherein the contact members on the respective housings are arranged such that said opposite sides of the solder tails with the hooks thereon face in opposing directions.

3. The assembly of claim 1 wherein said housing is elongated and has a plurality of said contact members mounted thereon in a linear array and wherein said plurality of contact members are arranged on the housing in common orientations such that said opposite sides of the solder tails with the hooks thereon face in the same direction.

4. The assembly of claim 1 wherein said housing is elongated and has a cavity along its length for receiving a mating edge of a second printed circuit board including a plurality of said contact members, the contact members being thin and mounted on the housing to form a closely-spaced linear terminal array, each contact member being adapted to engage a contact pad on the second printed circuit board when the second printed circuit board is inserted into the cavity.

5. The assembly of claim 1 wherein the straight side of the solder tail is aligned with the centerline of the aperture when the mounting posts are aligned with the holes in the printed circuit board.

6. An electrical connector assembly for mounting on a printed circuit board which includes a plurality of solder tail receiving apertures wherein the diameters of said apertures may vary within a predetermined range, comprising:
   a housing;
   means for mounting the housing on the printed circuit board and supporting the housing against lateral movement relative to the board; and
   a plurality of contact members mounted on the housing and each including a one-piece solder tail for positioning in an appropriate aperture in the printed circuit board, the solder tail having a generally straight side and a projecting hook on an opposite side the hook comprising two inclined intersecting surfaces, one surface adapted to contact the top surface of the printed circuit board when the solder tail is inserted into the aperture for guiding the solder tail into the aperture, the other inclined surface adapted to engage the bottom surface of the printed circuit board for retaining the connector assembly on the printed circuit board, the width of the solder tail between the straight side and the outermost point of the hook on the opposite side being no greater than the diameter of the smallest aperture within said range, and the centerline of the solder tail between said sides being offset, in the direction of the hook, relative to the centerline of any of said apertures within said range when the housing is supported on the printed circuit board.

7. The assembly of claim 6, including a pair of said housings and respective contact members, means fixing the housings together in spaced relationship and wherein the contact members on the respective housings are arranged such that said opposite sides of the solder tails with the hooks thereon face in the opposing directions.

8. The assembly of claim 6 wherein said housing is elongated and has a plurality of said contact members mounted thereon in a linear array.

* * * * *